(12) United States Patent
Erickson et al.

(10) Patent No.: US 7,212,016 B2
(45) Date of Patent: May 1, 2007

(54) APPARATUS AND METHODS FOR MEASURING RESISTANCE OF CONDUCTIVE LAYERS

(75) Inventors: Gary C. Erickson, Seattle, WA (US); Mark S. Pollack, Maple Valley, WA (US); Mark A. Negley, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/427,473

(22) Filed: Apr. 30, 2003

(65) Prior Publication Data

US 2004/0217766 A1 Nov. 4, 2004

(51) Int. Cl.
*G01R 31/26* (2006.01)
*G01R 27/08* (2006.01)

(52) U.S. Cl. .................. 324/719; 324/691; 324/724
(58) Field of Classification Search ........... 324/719, 324/691, 722, 724
See application file for complete search history.

(56) References Cited

U.S. PATENT DOCUMENTS

| | | | | |
|---|---|---|---|---|
| 3,676,776 A | * | 7/1972 | Bauer et al. ............... | 324/72.5 |
| 3,735,254 A | | 5/1973 | Severin ...................... | 324/716 |
| 3,783,375 A | * | 1/1974 | Bennett ...................... | 324/601 |
| 3,936,736 A | | 2/1976 | Ray ............................ | 324/642 |
| 4,570,116 A | | 2/1986 | Tedd et al. ................. | 324/649 |
| 4,667,149 A | * | 5/1987 | Cohen et al. .............. | 324/715 |
| 4,764,026 A | * | 8/1988 | Powell et al. ............. | 374/178 |
| 4,831,876 A | | 5/1989 | Porth et al. ............... | 73/204.16 |
| 4,888,546 A | | 12/1989 | Berry ........................ | 324/357 |
| 5,508,228 A | * | 4/1996 | Nolan et al. ................ | 438/614 |
| 6,028,437 A | * | 2/2000 | Potter ........................ | 324/757 |
| 6,154,041 A | * | 11/2000 | Cheng ........................ | 324/758 |

FOREIGN PATENT DOCUMENTS

| | | |
|---|---|---|
| EP | 0 299 875 A | 1/1989 |
| EP | 0 694 786 A | 1/1996 |

OTHER PUBLICATIONS

AZom.com, Tungsten, Printed from the internet Nov. 14, 2006, 3pgs.*
Nelson, Rick, High Speeds and Fine Precision Knock PCB Traces Off Pedestal, Test & Measurement World, Jan. 1, 2000, pp. 1-5, Newton, MA, USA.

* cited by examiner

*Primary Examiner*—Andrew H. Hirshfeld
*Assistant Examiner*—Jeff Natalini
(74) *Attorney, Agent, or Firm*—Lee & Hayes, PLLC

(57) ABSTRACT

Apparatus and methods for measuring the electrical resistance of conductive materials are disclosed. In one embodiment, an apparatus includes a housing, and first, second, third, and fourth conductive members projecting outwardly from the housing. The conductive members are engageable with an electrically-conductive material at a plurality of points distributed along a measurement axis. In an alternate embodiment, at least some of the conductive members include a spring-loaded portion such that a contact portion of the conductive member projects outwardly from the housing by a variable distance. In operation, the electrical resistance of the electrically-conductive material is determinable from a known current applied between the first and fourth conductive members, and a voltage measured between the second and third conductive members.

41 Claims, 3 Drawing Sheets

APPARATUS AND METHODS FOR MEASURING RESISTANCE OF CONDUCTIVE LAYERS

CROSS REFERENCE TO RELATED APPLICATIONS

This patent application is related to a concurrently-filed patent application entitled "Apparatus and Methods for Measuring Resistance of Conductive Layers" and bearing Ser. No. 10/427,359, which application is hereby incorporated by reference.

FIELD OF THE INVENTION

The present disclosure relates to measuring electrical resistance and, more specifically, to measuring electrical resistance of layers of conductive material.

BACKGROUND OF THE INVENTION

Due to continuing improvements in materials technology, modern aerospace vehicles include an increasing amount of structural components made of composite materials. Because vehicle components made of non-conducting composite materials may become degraded when subjected to electrical discharge (e.g. lightening strike, electromagnetic effects (EME), etc.), such components are typically coated with an electrically conductive material, such as conductive paints, anti-static coatings, thermal sprayed coatings, and the like.

Throughout various stages of development of such aerospace vehicles, measurements are often made of electrical resistance of a conductive layer that is disposed on a composite component of the vehicle. One known test device that has been successfully used for this purpose is shown in FIG. 1. As shown in FIG. 1, the prior art test device 100 includes first and second conductive strips 102, 104 disposed on a non-conductive layer 106 that is attached to a non-conductive substrate 110. In this example, the substrate 110 includes a flexible, compliant layer 111. Each conductive strip 102, 104 is operatively coupled to a conductive lead 112, 114 that extends from the test device 100 to a suitable piece of test equipment 120, such as a digital ohmmeter.

As further shown in FIG. 1, the conductive strips 102, 104 pass through the non-conductive layer 106 to an inner side of the non-conductive layer 106 (shown in phantom) prior to passing around an end 113 of the substrate 110. On the end 113, first and second auxiliary contact members 115, 116 are disposed on the non-conductive layer 106. Each of the first and second auxiliary contact members 115, 116 is electrically coupled to a corresponding one of the first and second conductive strips 102, 104, respectively, by a plated-through hole 117.

In operation, the test device 100 may be used by pressing the first and second conductive strips 102, 104 into engagement with a conductive layer 122 (not shown) to be tested. The test equipment 120 then measures the electrical resistance $R_T$ of the conductive layer 122 between the first and second conductive strips 102, 104 in ohms per square. Because the first and second conductive strips 102, 104 are disposed on the compliant layer 111, the non-conductive layer 106 and conductive strips 102, 104 may flex to conform to the curvature of the conductive layer 122. In an alternate mode of operation, the first and second auxiliary contact members 115, 116 may be pressed into engagement with the conductive layer 122 under test, and the resistance $R_T$ of the conductive layer 122 is then determined by the test equipment 120. Due to their relatively smaller size, the auxiliary contact members 115, 116 may be used on smaller surfaces in comparison with the first and second conductive strips 106, 107.

Although desirable results have been achieved using the prior art test device 100, recent developments in conductive coatings are placing increased demands on such apparatus. For example, in the past, conductive coatings have been characterized by relatively high resistance per square values which were readily capable of accurate measurement using the prior art test device 100. More modem conductive coatings, however, have relatively smaller resistance per square, thereby posing a greater challenge to such test apparatus.

As the resistance of the conductive coating 122 decreases, the additional component of measured resistance attributable to the contact resistance between the surfaces of each conductive strip 102, 104 and the conductive coating 122 becomes an ever-increasing percentage of the resistance measured by the test equipment 120, thereby increasing the uncertainty associated with the measurement. In some cases, the resistance of the conductive coating 122 may even be smaller than the component of contact resistance between the conductive strips 102, 104 and the conductive coating 122, thereby preventing accurate measurement of the resistance of the conductive coating 122 using the prior art test device 100. The contact resistance may also fluctuate depending on the force applied by the user to the test device 100 during testing, thereby introducing an additional component of uncertainty between successive test measurements. Therefore, there is an unmet need in the art for an improved test device capable of accurately and consistently measuring the resistance of modern, low resistance conductive coatings.

SUMMARY OF THE INVENTION

The present invention is directed to apparatus and methods for measuring the electrical resistance of electrically-conductive materials. Apparatus and methods in accordance with the present invention may advantageously provide improved accuracy of electrical resistance measurements, and may enable the accurate, consistent measurement of the resistance of certain conductive materials having relatively small resistance.

In one embodiment, an apparatus includes a housing, and first, second, third, and fourth conductive members projecting outwardly from the housing. The conductive members are engageable with an electrically-conductive material at a plurality of points distributed along a measurement axis. In an alternate embodiment, at least some of the conductive members include a spring-loaded portion such that a contact portion of the conductive member projects outwardly from the housing by a variable distance. The apparatus may further include a source operatively coupled to the first and fourth conductive members, and a meter operatively coupled to the second and third conductive members. In operation, the electrical resistance of the electrically-conductive material is determinable from a known value applied by the source and an observed value measured by the meter.

BRIEF DESCRIPTION OF THE DRAWINGS

The preferred and alternative embodiments of the present invention are described in detail below with reference to the following drawings.

DETAILED DESCRIPTION OF THE INVENTION

The present invention relates to apparatus and methods for measuring the electrical resistance of materials, and more specifically, to measuring the resistance of electrically-conductive coatings on component surfaces and the like. Many specific details of certain embodiments of the invention are set forth in the following description and in FIGS. 2–6 to provide a thorough understanding of such embodiments. One skilled in the art, however, will understand that the present invention may have additional embodiments, or that the present invention may be practiced without several of the details described in the following description.

Figure 1:
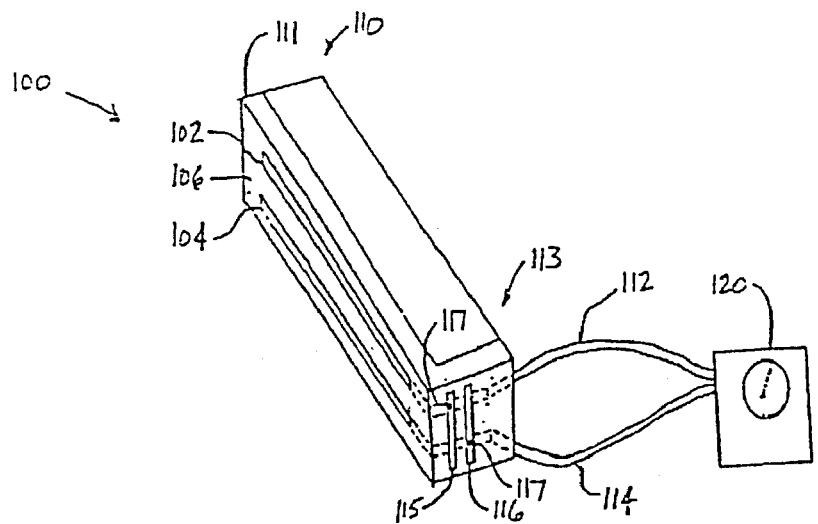
FIG. 1 is an isometric view of a test device for measuring electrical resistance of a conductive layer in accordance with the prior art.
Figure 2:
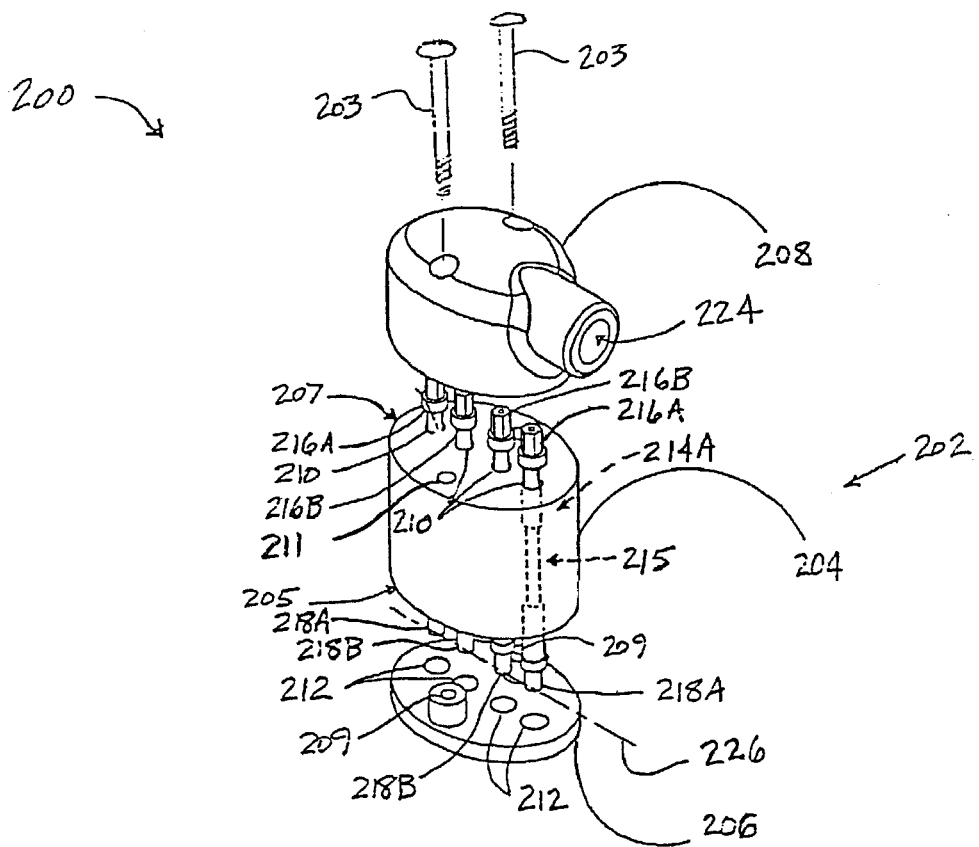
FIG. 2 is a partially-exploded isometric view of a test device for measuring electrical resistance of a conductive layer in accordance with an embodiment of the invention.
Figure 3:
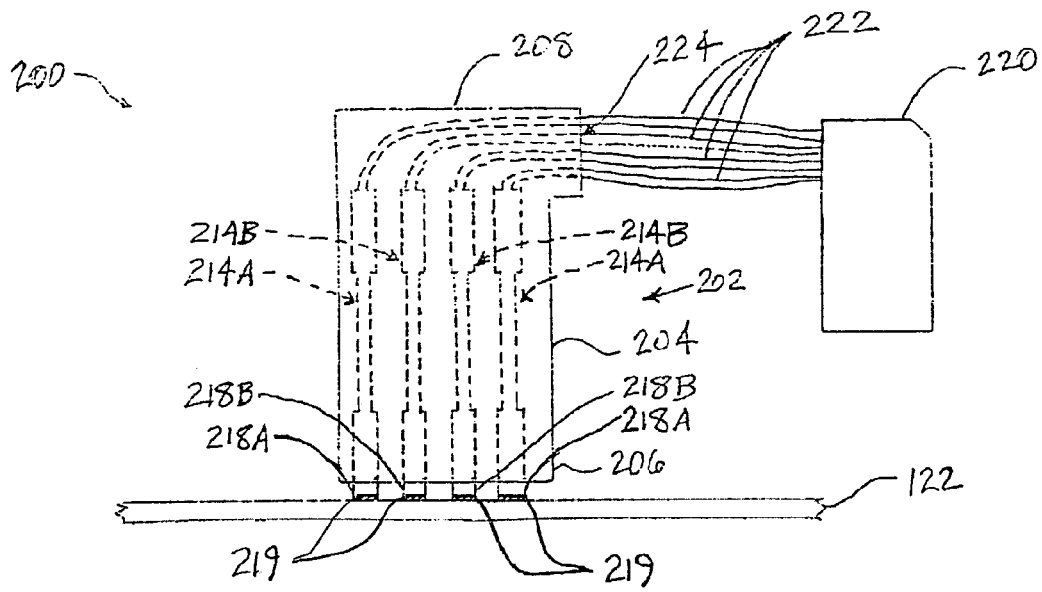
FIG. 3 is a side elevational view of the test device of FIG. 2 engaged with a conductive layer.

FIG. 2 is a partially-exploded isometric view of a test device 200 for measuring an electrical resistance $R_T$ of a conductive layer 122 (not shown) in accordance with an embodiment of the invention. FIG. 3 is a side elevational view of the test device 200 of FIG. 2 engaged with a conductive layer 122. In this embodiment, the test device 200 includes a housing 202 having a body portion 204, a base portion 206 adjacent a lower end 205 of the body portion 204, and a cap portion 208 adjacent an upper end 207 of the body portion 204. As best shown in FIG. 3, the body portion 204 has four channels 210 disposed therethrough and extending between the upper and lower ends 205, 207 of the body portion 204. Similarly, the base portion 206 has four apertures 212 disposed therethrough and aligned with the channels 210 of the body portion 204. The cap portion 208 has an enlarged, laterally-extending aperture 224 disposed therein. A pair of threaded fasteners 203 engage through the cap portion 208 and into a pair of threaded holes 211 in the body portion 204, securing these components of the housing 202 together as an assembly. Similarly, a pair of mounting projections 209 project upwardly from the base portion 206 and engage into corresponding cavities (not visible) in the body portion 204, securing the base portion 206 to the body portion 204.

As shown in FIGS. 2 and 3, an elongated conductive member 214 is positioned within each of the four channels 210 of the housing 202. The four conductive members 214 include a pair of outer conductive members 214A and a pair of inner conductive members 214B. Each conductive member 214 includes a lug (or first) portion 216 and a contact (or second) portion 218. As best shown in FIG. 3, the contact portions 218 of the conductive members 214 project outwardly from the housing 202 beyond the base portion 206, while the lug portions 216 are substantially enclosed within the cap portion 208. The lug portions 216 retain the conductive members 214 in place within the body portion 204 of the housing 202. As described more fully below, the outwardly projecting contact portions 218 are engageable with the conductive layer 122 along a contact axis 226 (FIG. 2) to enable measurement of the resistance $R_T$ of the conductive layer 122.

It will be appreciated that the conductive members 214 may be formed of any desired conductive material, including copper, gold, beryllium, alloys thereof, or any other suitable conductive material. Furthermore, the conductive members 214 may be modified in a variety of ways from the particular embodiment shown in FIGS. 2 and 3. For example, in alternate embodiments, the cross-sectional shape of the contact portions 218 may be circular, square, hexagonal, or any other desired shape. Similarly, the housing 202 may be formed of any suitable material, including, for example, an electrically-insulative thermoplastic material such as DELRIN®, NYLATRON®, and TEFLON®. In one particular embodiment, the housing 202 may be formed of a glass-mica composition or other glass composition having desirable properties, including reduced water absorption characteristics.

In one particular embodiment, the conductive members 214 may include spring-loaded members, such as spring-loaded or "pogo" pins of the type that are generally known and commercially-available from various suppliers, including, for example, Interconnect Devices, Inc. of Kansas City, Mo. The spring-loaded members may be, for example, the contact portions 218 of the conductive members 214, or may include any other portion of the conductive members 214, such as a mid-portion 215 (FIG. 2) situated between the lug portions 216 and the contact portions 218.

In a further embodiment, each of the contact portions 218 may include a compliant portion 219. The compliant portion 219 may be a flexible, compliant layer that is electrically conductive, and may be positioned on a tip or end of the contact portion 218 to ensure a uniform contact area, particularly when testing is performed on an irregular or uneven conductive layer. The compliant potions 219 may be formed of any suitable compliant conductive materials. In one particular embodiment, for example, the compliant portion 219 may be formed of a conductive, metal-containing (e.g. silver, nickel, gold, etc.) polysulfide (e.g. Thiokol LP polymer) having a minimum durometer A hardness of 30.

Figure 6:
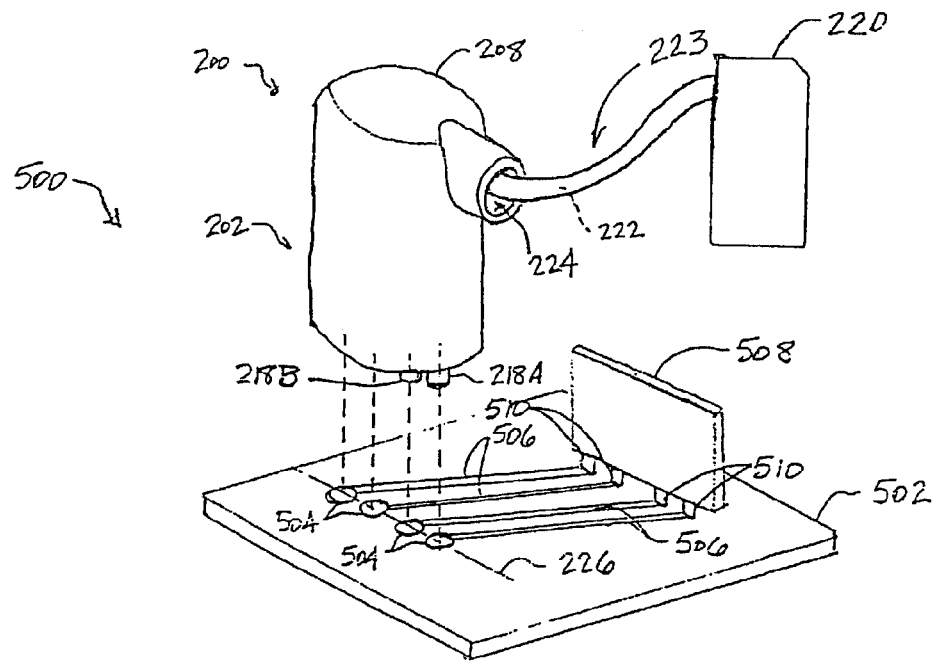
FIG. 6 is an isometric view of a calibration device in accordance with yet another embodiment of the invention.

As further shown in FIG. 3, an article of test equipment 220 may be coupled to the conductive members 214 of the test device 200 by a plurality of conductive leads 222 that pass through the aperture 224 in the cap portion 208. In an alternate embodiment, the conductive leads 222 may be disposed within a lead bundle 223 (FIG. 6). The test equipment 220 may be any of a variety of widely-known, commercially-available devices used for measuring electrical resistance, including, for example, digital ohm meters (or digital milliohm meters) offered by Keithley Instruments, Inc. of Cleveland, Ohio, or by Agilent of Colorado Springs, Colo., or by AVO Biddle Instruments Corporation of Blue Bell, Pa.

Figure 4:
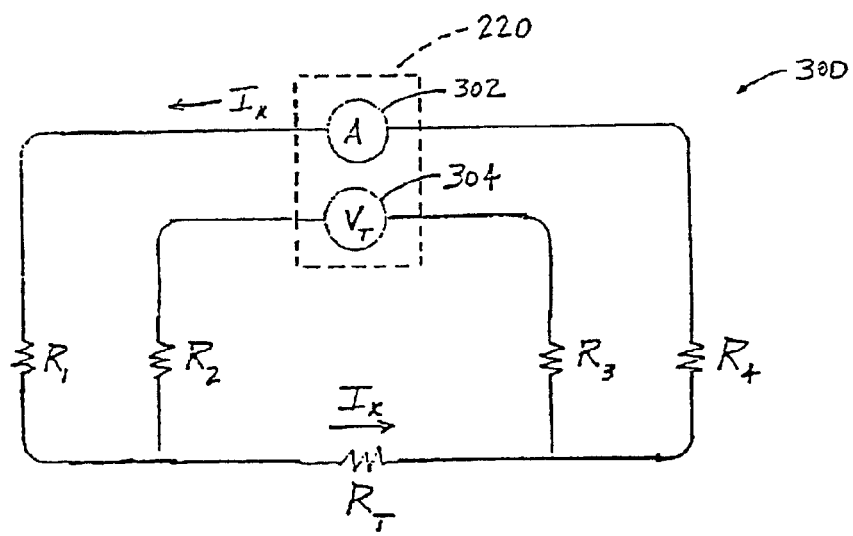
FIG. 4 is a circuit diagram for the test device of FIG. 2 engaged with a conductive layer in accordance with an embodiment of the invention.

FIG. 4 is a circuit diagram 300 for the test device 200 of FIG. 2 engaged with the conductive layer 122 during a test in accordance with an embodiment of the invention. In this embodiment, the resistance of one of the outer conductive members 214A is represented by a first resistance $R_1$, the resistance of one of the inner conductive members 214B is represented by a second resistance $R_2$, the resistance of the other one of the inner conductive members 214B is represented by a third resistance $R_3$, and the resistance of the other one of the outer conductive members 214A is represented by a fourth resistance $R_4$. Similarly, as set forth above, the electrical resistance of the conductive layer 122 between the inner conductive members 214B is represented by a test resistance $R_T$.

A source 302 is coupled in series between the first and fourth resistances $R_1$, $R_4$, and a meter 304 (e.g. a voltmeter) is coupled in series between the second and third resistances $R_2$, $R_3$. The source 302 and the meter 304 may be included in the test equipment 220, or alternately, may be separate components. The circuit diagram 300 shown in FIG. 4 may be of a variety known as a Kelvin double bridge circuit, or may be any other suitable circuit.

In operation, the source 302 applies a known current $I_K$ to the circuit 300 which flows through the first resistance $R_1$, the test resistance $R_T$, and the fourth resistance $R_4$. The meter 304 measures a characteristic value, such as a test voltage $V_T$, across the test resistance $R_T$. Because only a negligible amount of current passes through the meter 304, practically speaking, there is no current passing through the second and third resistances $R_2$, $R_3$, and therefore, the current passing through the test resistance $R_T$ is approximately the known current $I_K$. Using the measured test voltage $V_T$ and the known current $I_K$, the test resistance $R_T$ is determinable using Ohm's law according to the following Equation 1:

$$R_T = V_T / I_K \quad (1)$$

The test device 200 advantageously provides improved measurement of the electrical resistance of the conductive layer 122. Because the test resistance $R_T$ is measured between the inner conductive members 214B, and because only a negligible amount of current passes through the inner conductive members 214B, the additional component of measurement uncertainty caused by the resistance associated with the surface-to-surface contact between the conductive members 214 and the conductive layer 122 is eliminated from the resulting measurement. The test device 200 may therefore be employed to measure the resistance of conductive coatings having relatively small resistance, including such coatings having a resistance value smaller than the surface-to-surface contact resistance between the conductive contacts and the conductive coating.

Furthermore, because the conductive members 214 may include spring-loaded portions, the amount of force applied between the contact portions 218 and the conductive layer 122 may be more consistent than the prior art device 100, which relies on the amount of force applied by hand by the user. In the test device 200, however, the spring constant of the spring-loaded portions of the conductive members 214 may be properly selected (along with the thickness of the base portion 206) to ensure a consistent, positive engagement of the contact portions 218 of the conductive members 214 with the conductive layer 122. Because the spring-loaded conductive members 214 have a relatively consistent spring constant, the contact portions 218 may be positively engaged against the conductive layer 122 with greater consistency and reliability, thereby resulting in improved measurement consistency and accuracy.

Another advantage of the test device 200 in accordance with the invention is that the contact portions 218 that include the compliant portion 219 may ensure a uniform contact area between the contact portions 218 and the conductive layer 122, especially for irregular or uneven conductive layers, including the back sides of certain composite components. Such uniform contact areas may improve uniformity between successive resistance measurements, and may reduce the possibility of arcing when current is applied through the outer conductive members 214A.

Figure 5:
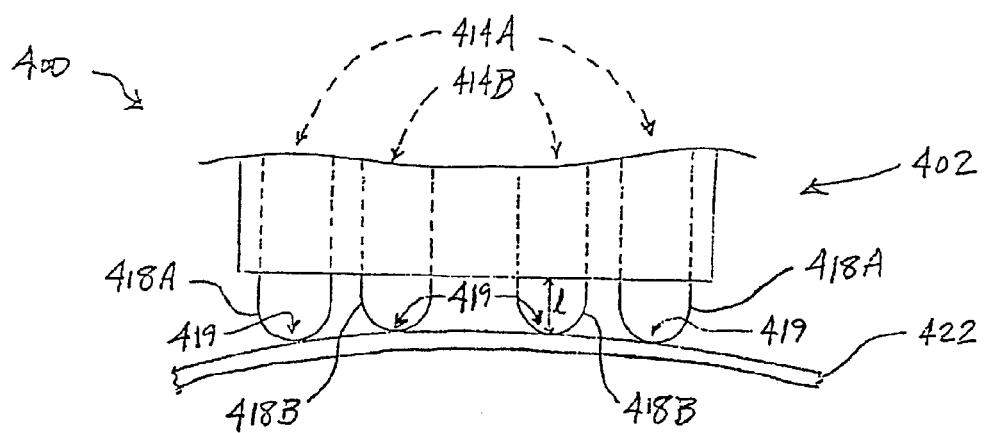
FIG. 5 is an enlarged, partial side elevational view of the test device having spring-loaded conductive members engaged with a non-planar conductive layer in accordance with an alternate embodiment of the invention.

An additional advantage of the test device 200 having spring-loaded portions is that improved measurements of non-planar conductive layers may be achieved. For example, FIG. 5 is an enlarged, partial side elevational view of a test device 400 having spring-loaded conductive members 414 engaged with a non-planar conductive layer 422 in accordance with an alternate embodiment of the invention. As shown in FIG. 5, each conductive member 414 includes a contact portion 418 that projects outwardly from the housing 402 by a variable distance 1 to contact the non-planar conductive layer 422. In the embodiment shown in FIG. 5, the contact portions 418 include a rounded tip 419 to ensure a consistent contact area with the non-planar conductive layer 422. In alternate embodiments, any suitable contact configuration may be employed. In the embodiment shown in FIG. 5, the axis of contact 226 between the tip portions 419 and the conductive layer 422 is a curved axis of contact that conforms to the curvature of the non-planar conductive layer 422. Because the conductive members 414 include spring-loaded portions that enable the contact portions 418 to extend outwardly by a variable distance 1 to contact the non-planar conductive layer 422, the test device 400 may advantageously be used to measure the resistance $R_T$ of layers having non-planar surfaces with greater accuracy and reliability compared with the prior art devices.

It may be appreciated that the uncertainty of the test resistance $R_T$ measured by the test equipment 220 may depend on several factors, including the spacing between the contact portions 218, the cross-sectional shape of the contact portions 218, the thickness of the conductive layer 122, the spring constant of the spring-loaded conductive members, the current losses into the surrounding portions of the conductive layer 122, and a variety of other factors. It may also be appreciated that the impact of such factors may vary from application to application. Therefore, during day-to-day operations, it may be desirable to attempt to reduce these uncertainties before performing a particular test measurement on a conductive material.

FIG. 6 is an isometric view of a calibration device 500 in accordance with yet another embodiment of the invention. In this embodiment, the calibration device 500 includes a substrate 502 having a plurality of contact pads 504 disposed thereon. The contact pads 504 are sized, positioned, and otherwise adapted to engage with the contact portions 218 of the test device 200 along the contact axis 226. A plurality of conductive traces 506 are disposed on the substrate 502 and are coupled between the contact pads 504 and a calibration article 508. The calibration article 508 having a known resistance value $R_k$ is electrically coupled to the conductive traces 506 by any suitable means, such as pin connectors 510, solder bumps, or the like. The calibration article 508 may be removable to allow different calibration articles 508 to be engaged to the substrate 502, or alternately, the calibration article 508 may be fixed to the substrate 502.

In operation, the contact portions 218 of the test device 200 may be engaged with the contact pads 504, and in the manner described above, the test equipment 220 may be employed to determine a measured resistance $R_T$ of the calibration article 508. If the resistance $R_T$ measured by the test device 200 does not match the known resistance value $R_k$ of the calibration article 508, a correction factor may be determined. During subsequent measurements of the resistance of conductive layers under test, the correction factor may be applied to the resistance value returned by the test device 200 to mathematically compute the actual resistance value of the conductive layers under test. Alternately, if the resistance $R_T$ measured by the test device 200 does not match the known resistance value $R_k$ of the calibration article 508, the test equipment 220 may be adjusted (e.g. "re-zeroed") to compensate for the measurement uncertainties, and the subsequent measurements of conductive layers under test may be performed with the adjusted test equipment 220 settings.

The calibration device 500 advantageously reduces or eliminates the measurement uncertainties associated with the test device 200. Because the test device 200 may be easily and quickly calibrated using the calibration device 500 to determine a correction factor, or to adjust the test equipment to account for uncertainties, at least some of the factors that cause measurement uncertainties during use of the test device 200 may be accounted for, and the deleterious effects of these factors may be reduced or eliminated. Thus, the validity and accuracy of the resulting resistance measurements may be improved.

While specific embodiments of the invention have been illustrated and described herein, as noted above, many changes can be made without departing from the spirit and scope of the invention. Accordingly, the scope of the invention is not limited by the disclosure of the specific embodiments set forth above. Instead, the invention should be determined entirely by reference to the claims that follow.

What is claimed is:

1. An apparatus for measuring an electrical resistance of an electrically-conductive material, the apparatus comprising:
    a housing having a base portion, a cap portion and a centrally disposed body portion, the base portion and the cap portion being fixedly coupled to the body portion in an abutting relationship;
    first, second, third, and fourth conductive members projecting outwardly from the housing, the conductive members being engageable with the electrically-conductive material at a plurality of points distributed along a measurement axis, at least some of the conductive members having a compliant electrically-conductive metal-containing polymer tip portion configured to directly engage the electrically-conductive material and to at least partially promote a uniform contact area between the conductive member and the electrically-conductive material; and
    a calibration device that includes a substrate having a plurality of contact pads formed thereon and adapted to be engaged with the conductive members, a calibration article having a known resistance, and a plurality of conductive leads electrically coupling the contact pads with the calibration article.

2. The apparatus of claim 1, wherein at least some of the conductive members include a spring-loaded portion such that a contact portion of the conductive member projects outwardly from the housing by a variable distance.

3. The apparatus of claim 1, wherein the compliant portion comprises a metal-containing polysulfide.

4. The apparatus of claim 1 wherein the second and third conductive members are positioned between the first and fourth conductive members, and wherein the apparatus further comprises:
    a source operatively coupled to the first and fourth conductive members; and
    a meter operatively coupled to the second and third conductive members.

5. The apparatus of claim 4, wherein the source is operable to apply a current between the first and fourth conductive members.

6. The apparatus of claim 4, wherein the meter is operable to measure a voltage between the second and third conductive members.

7. The apparatus of claim 1, wherein each conductive member includes an elongated member extending along a longitudinal axis, and wherein the longitudinal axes of the elongated members are substantially parallel.

8. The apparatus of claim 1, wherein the housing includes a plurality of channels disposed therein, each conductive member being at least partially disposed within a corresponding one of the channels.

9. The apparatus of claim 1, wherein the body portion includes a plurality of channels disposed therein, each conductive member being at least partially disposed within a corresponding one of the channels;
    the base member includes a plurality of apertures disposed therethrough, each conductive member projecting through a corresponding one of the apertures; and
    the cap portion includes an opening disposed therethrough.

10. The apparatus of claim 1, wherein the metal-containing polymer tip portion further comprises metal atoms forming an integral part of the molecular structure of the polymer.

11. An apparatus for measuring a resistance of a conductive layer, the apparatus comprising:
    a housing member having a base portion, a cap portion and a body portion interposed between the base portion and the cap portion, the cap portion and the base portion substantially abutting and fixedly coupled to the body portion;
    first and second pairs of conductive members projecting outwardly from the housing member, the first pair of conductive members being positioned between the second pair of conductive members, the first and second pairs of conductive members being engageable with the conductive layer, at least some of the conductive members having a compliant electrically-conductive metal-containing polymer tip portion configured to directly engage the conductive layer and to at least partially promote a uniform contact area between the conductive member and the conductive layer;
    a device operatively coupled to at least the first pair of conductive members and being operable to determine a voltage between the first pair of conductive members; and
    a calibration device that includes a substrate having a plurality of contact pads formed thereon and adapted to be engaged with the conductive members, a calibration article having a known resistance, and a plurality of conductive leads electrically coupling the contact pads with the calibration article.

12. The apparatus of claim 11, wherein the device is further coupled to the second pair of conductive members and is operable to apply a current to the second pair of conductive members.

13. The apparatus of claim 11, further comprising a source operatively coupled to the second pair of conductive members, the source being operable to apply a current to the second pair of conductive members.

14. The apparatus of claim 11, wherein at least some of the conductive members include a spring-loaded portion such that a contact portion of the conductive member projects outwardly from the housing by a variable distance.

15. The apparatus of claim 11, wherein the compliant portion comprises a metal-containing polysulfide.

16. The apparatus of claim 11, wherein the first and second pairs of conductive members are simultaneously engageable with the conductive layer along an axis of contact.

17. The apparatus of claim 16, wherein the axis of contact is a curved axis of contact.

18. The apparatus of claim 11, wherein each conductive member includes an elongated member extending along a longitudinal axis, and wherein the longitudinal axes of the elongated members are substantially parallel.

19. The apparatus of claim 11, wherein the housing member includes a plurality of channels disposed therein, each conductive member being at least partially disposed within a corresponding one of the channels.

20. The apparatus of claim 11, wherein the body portion includes a plurality of channels disposed therein, each conductive member being at least partially disposed within a corresponding one of the channels;
the base member includes a plurality of apertures disposed therethrough, each conductive member projecting through a corresponding one of the apertures; and
the cap portion includes a port disposed therethrough, the first pair of conductive members being operatively coupled to the device by conductive leads passing through the port.

21. The apparatus of claim 11, wherein the metal-containing polymer tip portion further comprises metal atoms forming an integral part of the molecular structure of the polymer.

22. An apparatus for measuring resistance, comprising:
a housing having a base portion, a cap portion and a body portion positioned between the base portion and the cap portion, the cap portion and the base portion substantially abutting and fixedly coupled to the body portion;
first and second pairs of conductive members projecting outwardly from the housing, the first pair of conductive members being positioned between the second pair of conductive members, the first and second pairs of conductive members being engageable with a conductive layer, at least some of the conductive members having a compliant electrically-conductive metal containing polymer tip portion configured to directly engage the conductive layer and to at least partially promote a uniform contact area between the conductive member and the conductive layer;
a circuit operatively coupled to the first and second pairs of conductive members, the circuit being operable to apply an electrical current to the second pair of conductive members and to provide a measurement of a resulting voltage between the first pair of conductive members when the conductive members are engaged with the conductive layer; and
a calibration device that includes a substrate having a plurality of contact pads formed thereon and adapted to be engaged with the conductive members, a calibration article having a known resistance, and a plurality of conductive leads electrically coupling the contact pads with the calibration article.

23. The apparatus of claim 22, wherein the first and second pairs of conductive members are simultaneously engageable with the conductive layer along an axis of contact.

24. The apparatus of claim 22, wherein at least some of the conductive members include a spring-loaded portion such that a contact portion of the conductive member projects outwardly from the housing by a variable distance.

25. The apparatus of claim 22, wherein the compliant portion comprises a metal-containing polysulfide.

26. The apparatus of claim 22, wherein the circuit includes a Kelvin double bridge circuit.

27. The apparatus of claim 22, wherein the metal-containing polymer tip portion further comprises metal atoms forming an integral part of the molecular structure of the polymer.

28. A method of measuring a resistance of a conductive layer, the method comprising:
providing first and second pairs of conductive, members, the first pair of conductive members being positioned between the second pair of conductive members, at least some of the conductive members having a compliant electrically-conductive metal containing polymer tip portion configured to directly engage the conductive layer and to at least partially promote a uniform contact area between the conductive member and the conductive layer;
providing a housing having a base portion, a cap portion and a body portion positioned between the base portion and the cap portion, the cap portion and the base portion substantially abutting and fixedly coupled to the body portion, the housing further including a plurality of channels disposed therein, each conductive member being at least partially disposed within a corresponding one of the channels;
engaging the first and second pairs of conductive members with the conductive layer along a contact axis;
applying an electrical current to the first pair of conductive members;
determining a resulting voltage between the second pair of conductive members; and
performing a calibration measurement by engaging the first and second pairs of conductive members with a calibration device, wherein the calibration device includes a substrate having a plurality of contact pads formed thereon, a calibration article having a known resistance, and a plurality of conductive leads electrically coupling the contact pads with the calibration article, and wherein performing a calibration measurement includes engaging the first and second pairs of conductive members with the plurality of contact pads.

29. The method of claim 28, wherein engaging the first and second pairs of conductive members with the conductive layer includes at least partially compressing a spring member disposed within at least one of the conductive members.

30. The method of claim 28, wherein engaging the first and second pairs of conductive members with the conductive layer includes engaging the at least some compliant tip portions of the conductive members with the conductive layer, the compliant tip portions comprising a metal-containing polysulfide.

31. The method of claim 28, wherein engaging the first and second pairs of conductive members with the conductive layer along a contact axis includes engaging a tip portion of each conductive member with the conductive layer.

32. The method of claim 28, further comprising determining a resistance of the conductive layer based on the applied electrical current and the resultant voltage.

33. The method of claim 28, wherein the metal-containing polymer tip portion further comprises metal atoms forming an integral part of the molecular structure of the polymer.

34. A method of calibrating a resistance-measuring device having first and second pairs of conductive members, the first pair of conductive members being positioned between the second pair of conductive members, the method comprising:
providing a housing having a base portion, a cap portion and a body portion positioned between the base portion and the cap portion, the cap portion and the base portion substantially abutting and fixedly coupled to the body portion, the housing having a plurality of channels disposed therein, each of the conductive members being at least partially disposed within a corresponding one of the channels;
providing first and second pairs of contact pads, the first pair of contact pads being positioned between the second pair of contact pads;
providing a calibration article having a known resistance value;
engaging the first and second pairs of conductive members with the first and second pairs of contact pads, at least some of the conductive members having a compliant electrically-conductive metal-containing polymer tip portion configured to directly engage the contact pads and to at least partially promote a uniform contact area between the conductive member and the contact pads, respectively;
applying an electrical current to the first pair of conductive members; and
determining a resulting voltage between the second pair of conductive members.

35. The method of claim 34, wherein engaging the first and second pairs of conductive members with the first and second pairs of contact pads includes at least partially compressing a spring member disposed within at least one of the conductive members.

36. The method of claim 34, wherein engaging the first and second pairs of conductive members with the first and second pairs of contact pads includes engaging the at least some compliant metal-containing polymer tip portions of the conductive members with a corresponding one of the contact pads, the compliant tip portions comprising a metal-containing polysulfide.

37. The method of claim 34, further comprising determining a resistance of the conductive layer based on the applied electrical current and the resultant voltage.

38. The method of claim 34, further comprising determining a measured resistance of the conductive layer based on the applied electrical current and the resultant voltage, and comparing the measured resistance with the known resistance of the calibration article.

39. The method of claim 38, further comprising determining a correction factor to be applied to the measured resistance.

40. The method of claim 38, further comprising adjusting a measurement device to correct for a discrepancy between the measured resistance and the known resistance.

41. The method of claim 34, wherein the metal-containing polymer tip portion further comprises metal atoms forming an integral part of the molecular structure of the polymer.

* * * * *